(12) United States Patent
Jung (10) Patent No.: US 7,838,934 B2
(45) Date of Patent: Nov. 23, 2010

(54) SEMICONDUCTOR DEVICE AND METHOD FOR MANUFACTURING THE SAME

(75) Inventor: Myung Jin Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 227 days.

(21) Appl. No.: 11/975,167

(22) Filed: Oct. 17, 2007

(65) Prior Publication Data

US 2008/0042124 A1    Feb. 21, 2008

Related U.S. Application Data

(62) Division of application No. 11/293,614, filed on Dec. 2, 2005, now Pat. No. 7,300,846.

(30) Foreign Application Priority Data

Dec. 31, 2004    (KR) ............... 10-2004-0118276

(51) Int. Cl.
*H01L 29/94* (2006.01)
(52) U.S. Cl. .............. 257/347; 257/19; 257/353; 257/E21.619; 438/285; 438/295; 438/221; 438/222; 438/938
(58) Field of Classification Search ............. 257/347, 257/E21.619, E21.628; 438/285, 295, 221, 438/222
See application file for complete search history.

(56) References Cited

U.S. PATENT DOCUMENTS 6,111,267 A    8/2000   Fischer et al.

(Continued)

FOREIGN PATENT DOCUMENTS

CN    1487565 A    4/2004

(Continued)

OTHER PUBLICATIONS

Paul D. Agnello, Stepen W. Bedell and Robert H. Dennard; "Relaxed, Low-Defect SGOI for Strained Si CMOS Applications"; esp@cenet; Abstract of Publication No. CN1503327; Publication Date: Jun. 9, 2004; esp@cenet Database—Worldwide, http://v3.espacenet.com/textdoc?DB=EPODOC&IDX=CN1503327&F=0.

(Continued)

*Primary Examiner*—George Fourson
*Assistant Examiner*—John M Parker
(74) *Attorney, Agent, or Firm*—The Law Offices of Andrew D. Fortney; Andrew D. Fortney (57) ABSTRACT

A semiconductor device and a method for manufacturing the same are disclosed, in which an insulating layer may be formed in a strained silicon layer under source/drain regions to substantially overcome conventional problems resulting from a channel decrease in the semiconductor device. A method for manufacturing the semiconductor device may include growing a germanium layer on a first silicon layer; forming at least two trenches in the germanium layer; forming an insulating layer in the germanium layer including the trenches; forming at least two gate insulating layer patterns by polishing the germanium layer and the insulating layer to coplanarity in the bottom of the trenches; re-growing and planarizing the germanium layer; forming a second silicon layer on the germanium layer; forming a gate insulating layer and a gate electrode on the second silicon layer between the at least two insulating layers; and forming source/drain regions by implanting impurity ions into the second silicon layer at sides of the gate electrode.

20 Claims, 6 Drawing Sheets

U.S. PATENT DOCUMENTS

| | | | |
|---|---|---|---|
| 6,190,975 | B1 | 2/2001 | Kubo et al. |
| 6,492,216 | B1 | 12/2002 | Yeo et al. |
| 6,846,720 | B2 | 1/2005 | Balasubramanian et al. |
| 6,869,897 | B2 | 3/2005 | Takenaka |
| 6,946,373 | B2 | 9/2005 | Agnello et al. |
| 7,170,084 | B1 | 1/2007 | Xiang et al. |
| 7,358,166 | B2 | 4/2008 | Agnello et al. |
| 2004/0075106 | A1 | 4/2004 | Takenaka |
| 2004/0094763 | A1 | 5/2004 | Agnello et al. |
| 2005/0009263 | A1 | 1/2005 | Yeo et al. |
| 2006/0030133 | A1 | 2/2006 | Agnello et al. |
| 2006/0160292 | A1 | 7/2006 | Anderson et al. |

FOREIGN PATENT DOCUMENTS

| | | | |
|---|---|---|---|
| CN | | 1503327 A | 6/2004 |

OTHER PUBLICATIONS

Masahiro Takenaka; "Production Method for Semiconductor Substrate, Semiconductor Substrate and Semiconductor Device"; esp@cenet; Abstract of Publication No. CN1487565; Publication Date: Apr. 7, 2004; esp@cenet Database—Worldwide, http://v3.espacenet.com/textdoc?DB=EPODOC&IDX=CN1487565&F=0.

Chinese Office Action dated Aug. 8, 2008 and English Translation; Chinese Patent Application No. 200510135990.0 filed Dec. 29, 2005; The State Intellectual Property Office of P.R.C., People's Republic of China.

Richard Ball; Strained SOI Tested at 45nm; Electronics Weekly; Apr. 13, 2005; 1 page; Reed Business Information, Reed Elsevier Inc.

Peter Singer; Strain Equals Gain; The New Face of Silicon; Semiconductor International; Dec. 1, 2004; 2 pages; Reed Business Information, Reed Elsevier Inc.

Stanley Wolf Ph.D and Richard N. Tauber Ph.D; Silicon Processing for the VLSI Era; vol. 1: Process Technology (Second Edition); Lattice Press; Sunset Beach, California, Published 2000.

SEMICONDUCTOR DEVICE AND METHOD FOR MANUFACTURING THE SAME

CROSS-REFERENCE TO RELATED APPLICATIONS

This application is a divisional of U.S. patent application Ser. No. 11/293,614, filed Dec. 2, 2005, now U.S. Pat. No. 7,300,846, which is incorporated herein by reference in its entirety. This application also claims the benefit of Korean Application No. P2004-117613, filed on Dec. 31, 2004, which is hereby incorporated by reference in its entirety.

BACKGROUND OF THE INVENTION

1. Field of the Invention

The present invention relates to a semiconductor device and, more particularly, to a semiconductor device and a method for manufacturing the same, in which a strained silicon layer functions as an active layer, and an insulating layer is formed in or under the strained silicon layer under source/drain regions, thereby improving the operational characteristics of the semiconductor device.

2. Discussion of the Related Art

Generally, when germanium (Ge) is put or deposited onto a silicon (Si) substrate, a germanium layer may be formed on the silicon substrate at a predetermined temperature. Then, a silicon layer may be formed on the germanium layer, so that a strained silicon layer is formed having a distance between certain locations in the Si lattice, such that the deposited Si lattice is substantially identical to that of the germanium layer. Accordingly, in this strained silicon layer, a lattice structure may contain greater distances between silicon atoms in the lattice.

With the trend toward miniaturization of semiconductor devices, conventional Si structures can have a problem relating to a decrease in the mobility of electrons and holes. In order to address this mobility problem, strained silicon may be used for a substrate of the semiconductor device.

Where a strained silicon substrate is used, it is possible to increase the mobility of electrons and holes, thereby improving the operational characteristics of the semiconductor devices thereon. However, such semiconductor devices have also been minimized to the nano-size range, whereby problems such as leakage current, drain induced barrier lowing (DIBL), and junction breakdown voltage may arise.

SUMMARY OF THE INVENTION

Accordingly, embodiments of the present invention are directed to a semiconductor device and a method for manufacturing the same that substantially obviate one or more problems due to limitations and disadvantages of the related art, as discussed above.

An object of the present invention is to provide a semiconductor device and a method for manufacturing the same, in which an insulating layer is formed in a strained silicon layer under source/drain regions so that leakage current and junction breakdown voltage can be reduced, while at the same time, enabling a path for heat to be relatively easily transmitted from the device. Accordingly, a semiconductor device according to embodiments of the present invention can be operated at a relatively high voltage as compared to conventional approaches.

Additional advantages, objects, and features of the invention will be set forth at least in part in the description which follows and in part will become apparent to those skilled in the art upon examination of the following or may be learned from practice of the invention. The objectives and other advantages of the invention may be realized and attained by the structure particularly pointed out in the written description and claims hereof, as well as the appended drawings.

To achieve these objects and other advantages and in accordance with the purpose of the invention, as embodied and broadly described herein, a semiconductor device can include: (i) a strained silicon substrate including a first silicon layer, a germanium layer, and a second silicon layer formed in sequence, wherein the strained silicon substrate contains an active region and a field region; (ii) a gate electrode formed on the active region of the strained silicon substrate; (iii) source/drain regions formed at sides of the gate electrode in the strained silicon substrate; and (iv) an insulating layer formed in the strained silicon substrate under the source/drain regions.

The insulating layer may extend substantially to a depletion point of the source/drain regions. Also, the insulating layer may be formed or located in the germanium layer of the strained silicon substrate. Further, the second silicon layer may have a thickness of from about 50 Å to about 250 Å.

In another aspect, a semiconductor device can include: (i) a strained silicon substrate including a first silicon layer, a germanium layer, and a second silicon layer in sequence; (ii) first and second gate electrodes on the strained silicon substrate; (iii) first conductive type source/drain regions at sides of the first gate electrode in the strained silicon substrate; (iv) second conductive type source/drain regions at sides of the second gate electrode in the strained silicon substrate; and (v) an insulating layer in the strained silicon substrate under the first and second source/drain regions.

In another aspect, a method for manufacturing a semiconductor device can include the steps of: (i) growing a first germanium layer on a first silicon layer; (ii) forming at least two trenches in the first germanium layer; (iii) forming an insulating layer in the first germanium layer including the trenches; (iv) forming at least two SOI insulating layer patterns by polishing the first germanium layer and the insulating layer to planarity at the bottom of the trenches; (v) re-growing and planarizing the germanium layer (e.g., growing a second germanium layer on the polished first germanium layer and planarizing the second germanium layer); (vi) forming a second silicon layer on the second germanium layer; (vii) forming a gate insulating layer and a gate electrode on the second silicon layer between the at least two insulating layers; and (viii) forming source/drain regions by implanting impurity ions into the second silicon layer at sides of the gate electrode.

A value X in the composition ratio of silicon ($Si_{1-x}$) to germanium ($Ge_x$) may be from 0.1 to 0.5, for example.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor device and a method for manufacturing the same according to embodiments of the present invention will be described with reference to the accompanying drawings.

Figure 1:
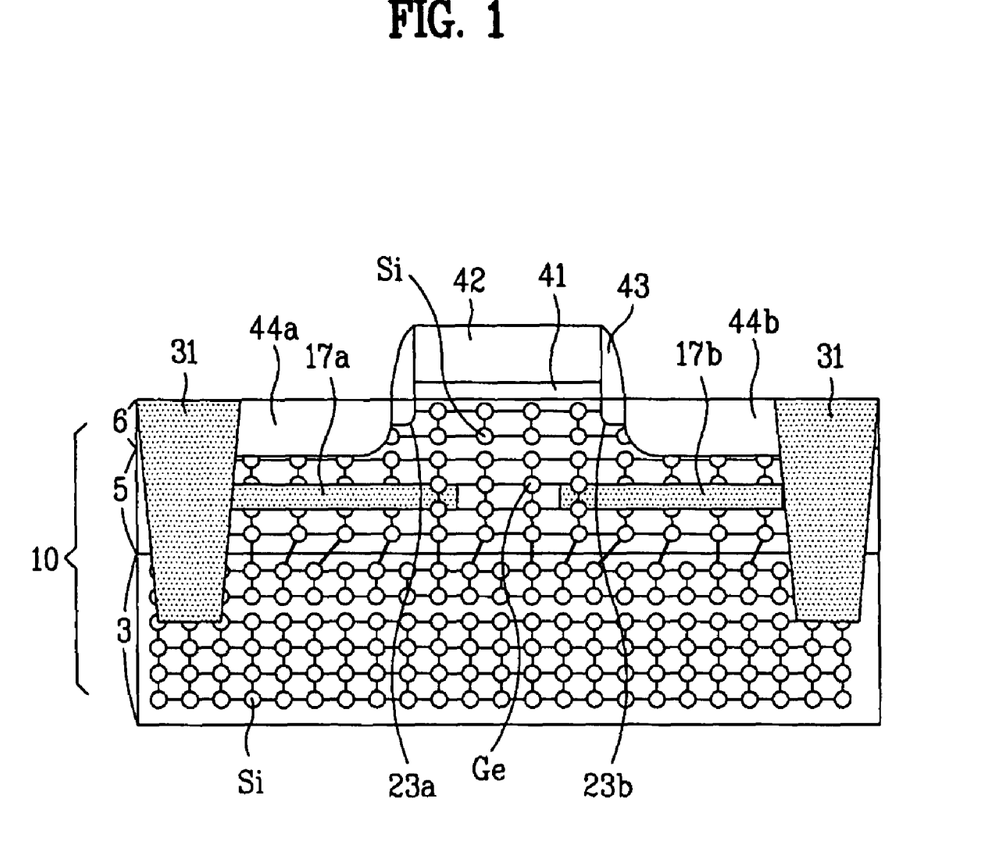
FIG. 1 is a cross-sectional view illustrating a semiconductor device according to embodiments of the present invention.

FIG. 1 shows a cross-sectional view of a semiconductor device according to embodiments of the present invention. In the semiconductor device according to the present invention, as shown in FIG. 1, a strained silicon substrate 10 may comprise a first silicon (Si) layer 3, a germanium (Ge) layer 5, and a second silicon (Si) layer 6. Germanium layer 5 can be grown on the first silicon layer 3 and the second silicon layer 6 can be grown on the germanium layer 5. Strained silicon substrate 10 may have defined therein an active region and a field region. In this example, a device isolation layer 31 can be formed in strained silicon substrate 10 of the field region. Also, a gate insulating layer 41, a gate electrode 42, source/drain regions 44a/44b, and insulating layers 17a/17b can be formed in the active region of the strained silicon substrate 10. The gate insulating layer 41 and the gate electrode 42 may be sequentially deposited on predetermined portions of the strained silicon substrate 10 of the active region. Then, the source/drain regions 44a/44b may be formed at opposed sides of the gate electrode 42 in the strained silicon substrate 10. Also, the insulating layers 17a/17b can be formed in the strained silicon substrate 10 under the source/drain regions 44a/44b.

In this particular example, insulating layer 17a/17b may be in direct contact with device isolation layer 31 and insulating layer 17a/17b can be formed in germanium layer 5 of strained silicon substrate 10. In addition, sidewall insulating layer 43 may be formed at a sidewall of gate electrode 42 and gate insulating layer 41. Sidewall insulating layer 43 may comprise an oxide (e.g., silicon dioxide), a nitride (e.g., silicon nitride), or both (e.g., silicon nitride on an oxide buffer layer), as is known in the art.

Referring to FIGS. 2A-2F, a method for manufacturing a semiconductor device according to embodiments of the present invention will be described. FIG. 2A to FIG. 2F are cross-sectional views illustrating the process steps for manufacturing a semiconductor device according to embodiments of the present invention.

Figure 2A:
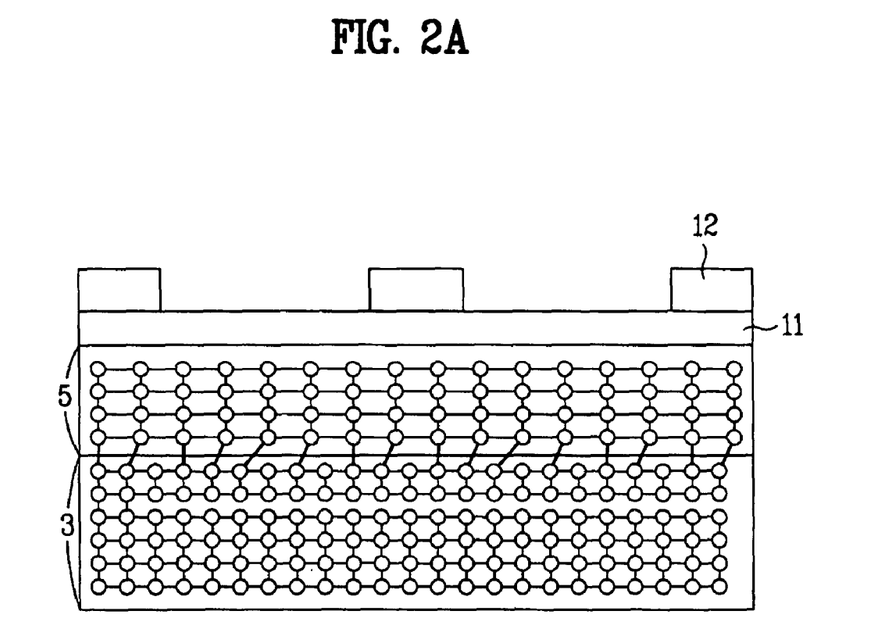
FIG. 2A to FIG. 2G are cross-sectional views illustrating process steps for manufacturing a semiconductor device according to embodiments of the present invention.

As shown in FIG. 2A, germanium layer 5 can be formed or grown on first silicon layer 3 by epitaxial growth. Then, a first insulating layer 11 may be deposited on germanium layer 5. At this time, a distance between atoms in the lattice of the germanium layer 5 may be greater than a distance between atoms in the lattice of the first silicon layer 3.

As an alternative for forming germanium layer 5 on first silicon layer 3 by epitaxial growth, it is possible to provide a substrate having silicon ($Si_{1-x}$) and germanium ($Ge_x$) at a composition ratio where x is from 0.1 to 0.5.

Subsequently, a photoresist layer may be coated on first insulating layer 11 and then the photoresist layer corresponding to the source/drain regions may be removed by conventional exposure and development techniques, thereby forming first photoresist pattern 12.

Figure 2B:
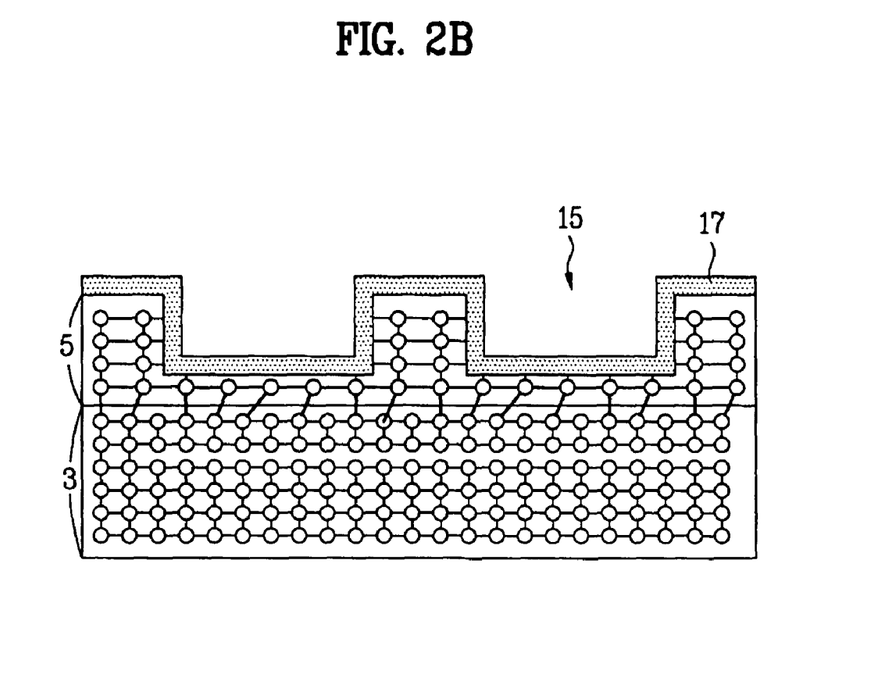

As shown in FIG. 2B, first insulating layer 11 and germanium layer 5 may be removed to a predetermined depth using first photoresist pattern 12 as a mask, thereby forming trench 15. Next, first photoresist pattern 12 and first insulating layer 11 may be removed completely. Then, second insulating layer 17 can be formed on substantially an entire surface of germanium layer 5, including inner walls of trench 15. Second insulating layer 17 may be formed by CVD (chemical vapor deposition, such as plasma enhanced [PE]-CVD or high density plasma [HDP]-CVD, from silicon sources such as TEOS or silane [$SiH_4$], and oxygen sources such as ozone [$O_3$] or oxygen [$O_2$], as is known in the art) or by conventional wet or dry thermal oxidation, which may also repair any damage to the Ge layer 5 resulting from the previous etching process.

Figure 2C:
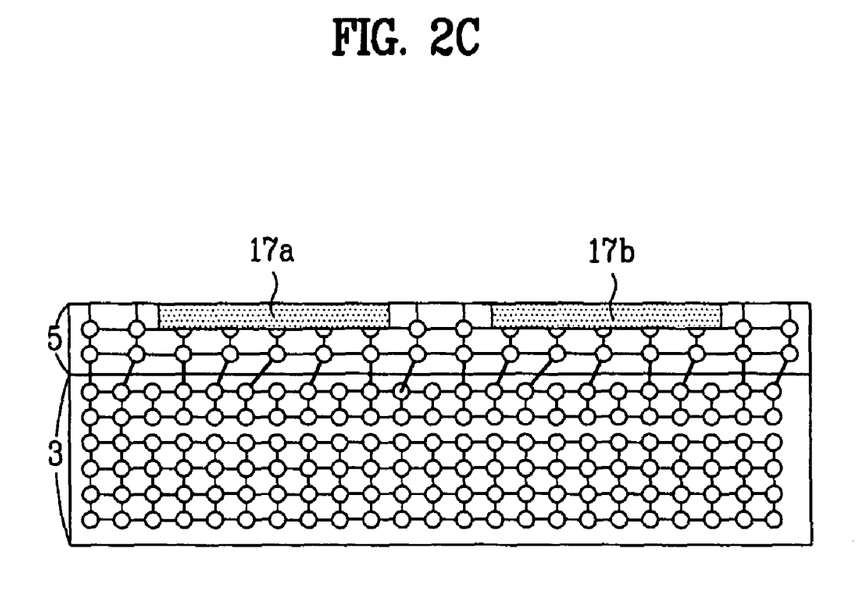

As shown in FIG. 2C, the second insulating layer 17 and the germanium layer 5 may be partially removed by CMP (Chemical Mechanical Polishing), whereby the germanium layer 5 and the second insulating layer 17 may be planarized to substantial coplanarity (e.g., at the bottom of the trench 15). As a result, it is possible to form the insulating layer patterns 17a/17b.

Insulating layer patterns 17a/17b may extend substantially to depletion points of the source/drain regions in order to increase leakage paths of the source/drain regions and also to decrease junction capacitance. Alternatively, the source/drain regions (e.g., 44a/44b in FIG. 1) may be formed such that their depletion points or regions are above the upper surface of insulating layer patterns 17a/17b. In addition, the space between insulating layer patterns 17a/17b (i.e., the insulating layer is not continuous) may help the heat generated between the source region and the drain region to be discharged relatively easily.

Figure 2D:
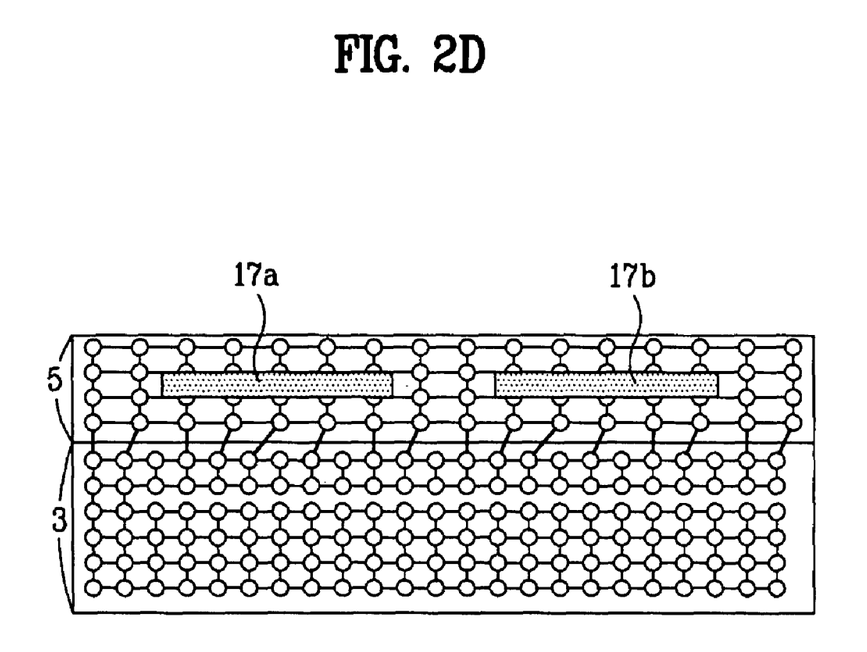

As shown in FIG. 2D, after re-growing germanium layer 5 (e.g., forming a second Ge layer) on the substrate including insulating layer patterns 17a/17b, e.g., by epitaxial growth, germanium layer 5 may be planarized by CMP, since the portions of germanium layer 5 on or over the insulating layer patterns 17a/17b may be relatively thin during or as a result of re-growing the germanium layer 5.

Figure 2E:
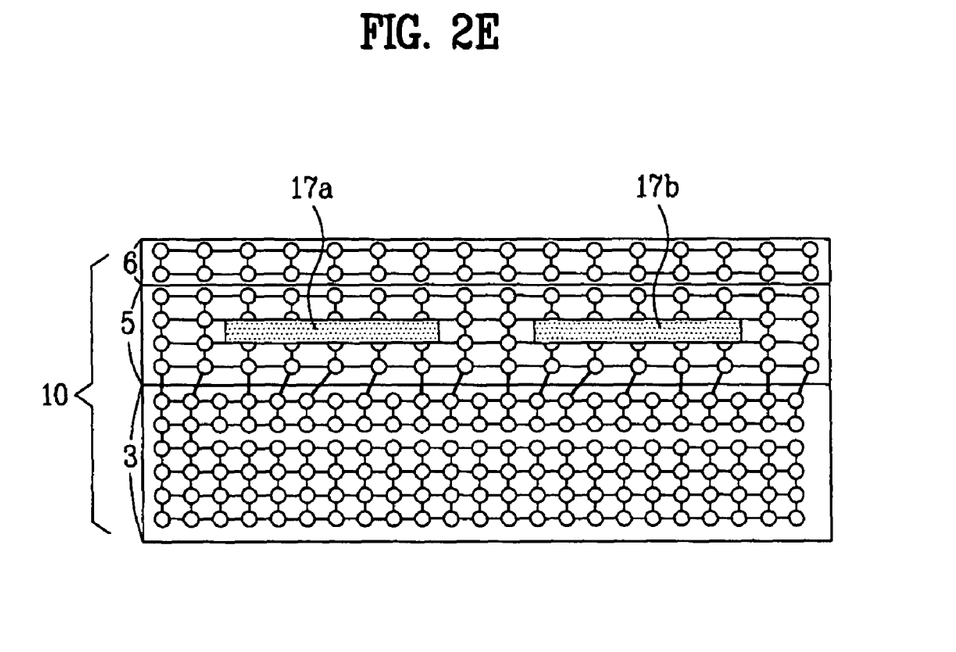

As shown in FIG. 2E, second silicon layer 6 may be formed on the planarized germanium layer 5. Second silicon layer 6 may have a thickness of from about 50 Å and 250 Å by epitaxial growth, thereby forming strained silicon substrate 10 having first silicon layer 3, germanium layer 5, and second silicon layer 6 deposited in sequence. The distances between atoms of the lattice of second silicon layer 6 are substantially identical to the distances between atoms of the lattice of germanium layer 5.

Figure 2F:
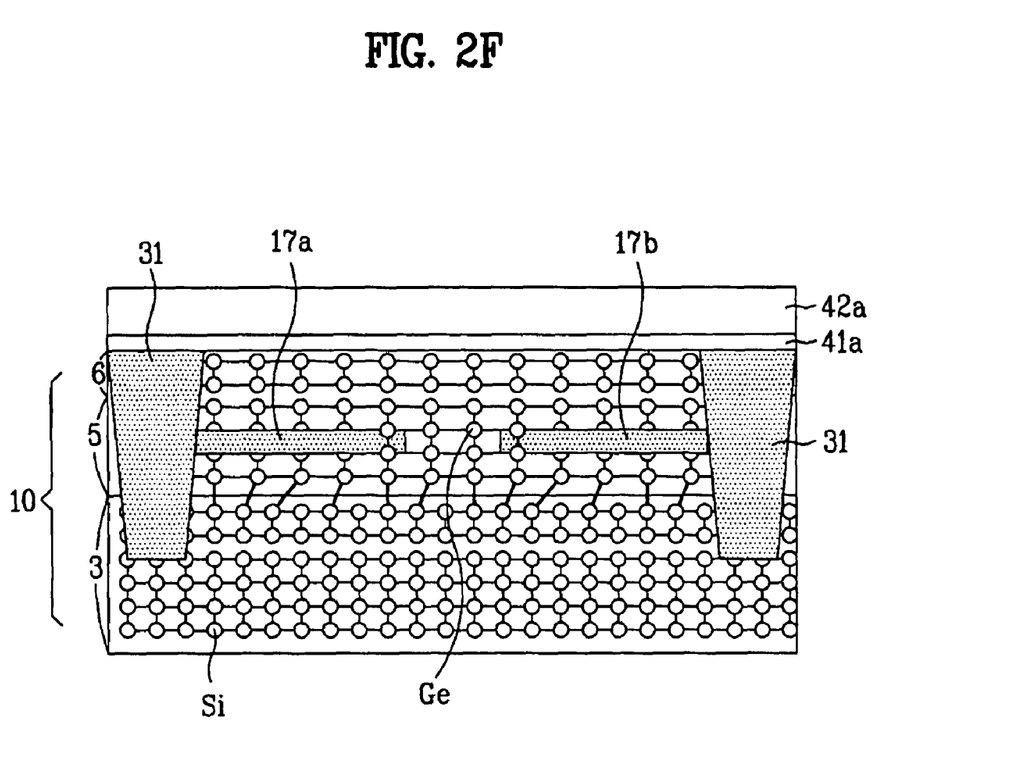

As shown in FIG. 2F, strained silicon substrate 10 may comprise defined active region(s) and field region(s). In this example, strained silicon substrate 10 of the field region may be etched to a predetermined depth, thereby forming the trench. Also, an insulating layer may be formed or deposited in the trench, whereby it is possible to form the device isolation layer 31, after appropriate planarization (e.g., by CMP). Then, insulating layer 41a for gate insulation and conductive layer 42a may be sequentially deposited or grown on strained silicon substrate 10, including device isolation layer 31.

Figure 2G:
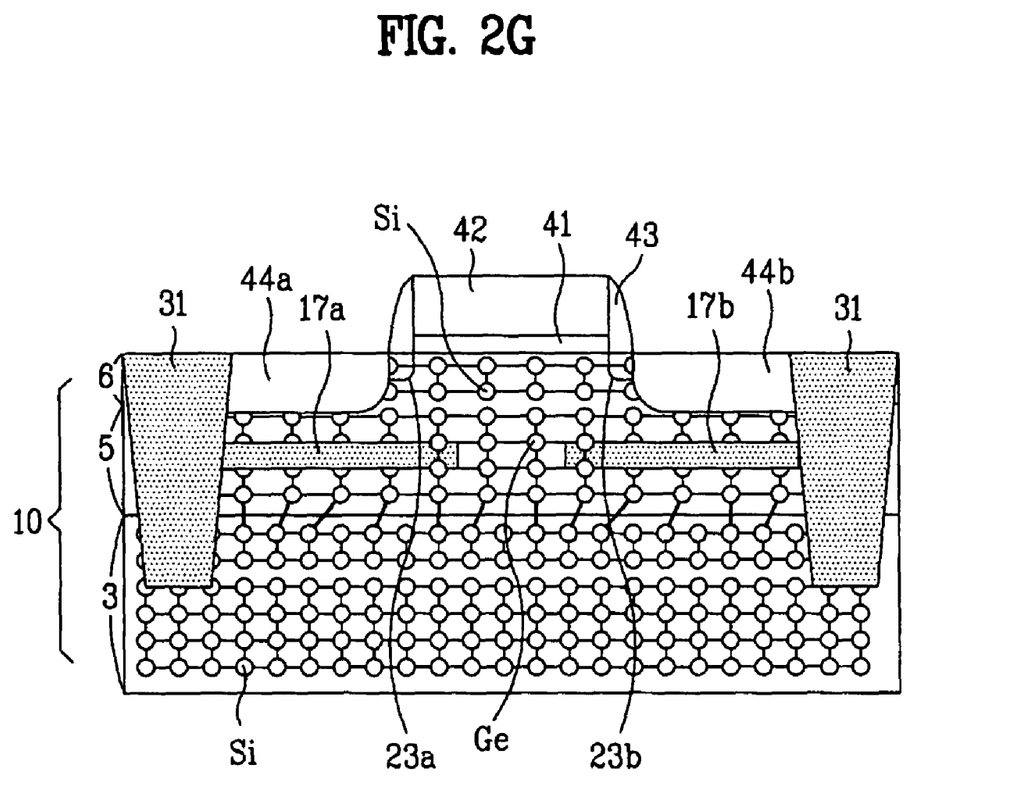

As shown in FIG. 2G, insulating layer 41a for gate insulation and the conductive layer 42a may be selectively removed, thereby forming gate insulating layer 41 and gate electrode 42. A width of each of gate insulating layer 41 and gate electrode 42 may correspond to a channel width of a transistor. That is, the width in each of the gate insulating layer 41 and the gate electrode 42 may be greater than the distance between the insulating layer patterns 17a/17b, whereby the depletion points of the source/drain regions are substantially covered by the insulating layer patterns 17a/17b. Accordingly, an associated leakage path of leakage current can be increased. Thus, according to certain embodiments, the gate electrode 42 may overlap with the insulating layer patterns 17a/17b.

Subsequently, lightly-doped impurity ions may be implanted using gate insulating layer 41 and gate electrode 42 as a mask, thereby forming lightly-doped drain (LDD) regions 23a/23b at both sides of gate electrode 42 in strained silicon substrate 10.

Then, an insulating layer may be deposited on substantially an entire surface of substrate 10. Next, the deposited insulating layer may be anisotropically etched, thereby forming spacer 43 at a side of gate electrode 42 and gate insulating layer 41. After that, highly-doped impurity ions may be implanted to the active region of strained silicon substrate 10 by using gate electrode 42 and spacer 43 as a mask, thereby forming source/drain regions 44a/44b.

Figure 3:
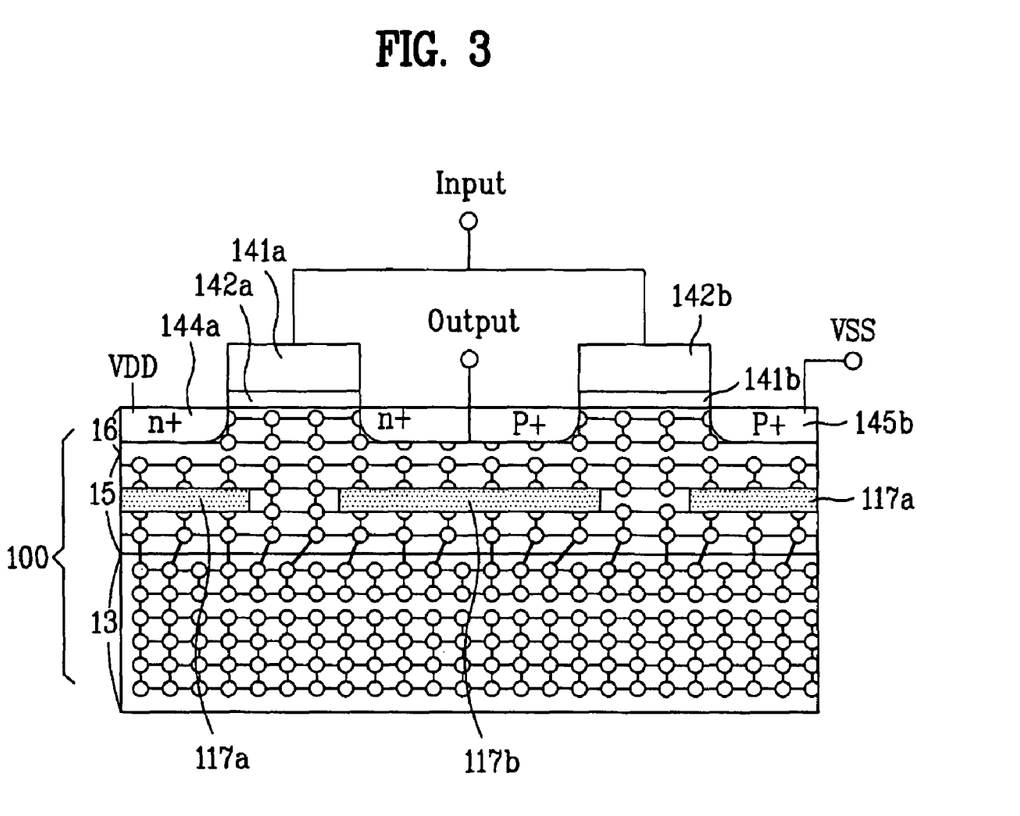
FIG. 3 is a cross-sectional view illustrating a CMOS semiconductor device according to embodiments of the present invention.

Referring to FIG. 3, the semiconductor device according to embodiments of the present invention may be applied to an exemplary CMOS type structure. In the exemplary CMOS type semiconductor device according to embodiments of the present invention, strained silicon substrate 100 may comprise a first silicon (Si) layer 13, a germanium (Ge) layer 15, and a second silicon (Si) layer 16. The germanium layer 15 can be formed or grown on first silicon layer 13 and then second silicon layer 16 can be formed or grown on germanium layer 15, for example. In addition, NMOS gate insulating layer 142a, NMOS gate electrode 141a, PMOS gate insulating layer 141b, and PMOS gate electrode 142b may be formed on predetermined portions of strained silicon substrate 100, as shown.

Then, highly-doped n-type source/drain regions 144a may be formed at both sides of NMOS gate electrode 141a in strained silicon substrate 100. Also, highly-doped p-type source/drain regions 145b may be formed at both sides of PMOS gate electrode 142b in strained silicon substrate 100. Then, insulating layers 117a/117b may be formed in strained silicon substrate 100 under n-type source/drain regions 144a and p-type source/drain regions 145b.

Insulating layers 117a/117b may be formed in germanium layer 15 of strained silicon substrate 100, where insulating layers 117a/117b may be extended toward the channel to cover the depletion points of source/drain regions 144a and 145b.

According to various embodiments of the present invention, even for an exemplary CMOS transistor, relatively high electron mobility can be attained, effectively removing the need for forming an additional n-type well and p-type well. This, according to embodiments of the present invention, it is not necessary to provide a device isolation layer between the NMOS and PMOS transistors.

As described above, the semiconductor device and the method for manufacturing the same have the following advantages. First, the insulating layer may be formed in a strained silicon substrate under the source/drain regions. As a result, problems related to decreased electron and hole mobility of the compact semiconductor device can be reduced or minimized. Furthermore, the size of the resulting semiconductor device may be minimized relative to conventional approaches and leakage current generated by the channel decrease can be reduced or minimized. According to implementations of embodiments of the present invention, a saturated drive current was found to be improved by about 20% to 40%.

Also, a drain induced barrier lowing (DIBL) and a junction breakdown voltage decrease may be seen by a reduction in leakage current according to embodiments. As such, semiconductor devices in the nano-size range, as well as semiconductor devices that can be operated at relatively high voltages, as compared to those made using conventional techniques, can be realized. Furthermore, according to certain embodiments, electron mobility can be improved by more than 50% over conventional approaches, thereby improving the efficiency of the semiconductor device.

For CMOS semiconductor devices, the conventional process for forming an n-type well (N-well) and a p-type well (P-well) can be omitted, thereby increasing yield and decreasing unit cost of production. In addition, according to embodiments, heat generated between the source region and the drain region may be relatively easily discharged by the space between the insulating layers (i.e., the insulating layer is not continuous) so that the semiconductor device efficiency is not lowered due to this heat. Further, when forming such a CMOS semiconductor device, there is no requirement for providing a device isolation layer between the NMOS and the PMOS transistors. Thus, the overall size of the semiconductor device can be reduced or minimized as compared to conventional approaches.

It will be apparent to those skilled in the art that various modifications and variations can be made in embodiments of the present invention without departing from the spirit or scope of the invention. Thus, it is intended that the present invention covers modifications and variations of the exemplary embodiments provided herein consistent with the scope of the appended claims and their equivalents.

What is claimed is:

1. A semiconductor device, comprising:
    a strained silicon substrate having a first silicon layer, a germanium layer, and a second silicon layer in sequence, the strained silicon substrate having an active region and a field region;
    a device isolation layer in the field region of the strained silicon substrate;
    a gate electrode on the active region of the strained silicon substrate;
    source/drain regions at sides of the gate electrode in the strained silicon substrate; and
    a first insulating layer in the strained silicon substrate under one of the source/drain regions and a second insulating layer in the strained silicon substrate under another of the source/drain regions, and a portion of the strained silicon substrate is between the first and second portions of the insulating layer, wherein the device isolation layer contacts the insulating layer.

2. The semiconductor device of claim 1, further comprising a spacer at a sidewall of the gate electrode.

3. The semiconductor device of claim 1, wherein the insulating layer extends at least to a depletion point of the source/drain regions.

4. The semiconductor device of claim 1, wherein the insulating layer is in the germanium layer of the strained silicon substrate.

5. The semiconductor device of claim 1, wherein the second silicon layer has a thickness of from about 50 Å to about 250 Å.

6. The semiconductor device of claim 1, further comprising a gate insulating layer between the gate electrode and the second silicon layer.

7. The semiconductor device of claim 6, wherein the gate insulating layer and the gate electrode are on the second silicon layer between the first and second insulating layer portions.

8. The semiconductor device of claim 1, wherein the germanium layer comprises epitaxial germanium.

9. The semiconductor device of claim 8, wherein the second silicon layer comprises epitaxial silicon.

10. The semiconductor device of claim 1, wherein the germanium layer comprises silicon ($Si_{1-x}$) and germanium ($Ge_x$) in a composition ratio where x is from 0.1 to 0.5.

11. A semiconductor device, comprising:
a strained silicon substrate having a first silicon layer, a germanium layer, and a second silicon layer in sequence;
first and second gate electrodes on the strained silicon substrate;
first source/drain regions at sides of the first gate electrode in the strained silicon substrate;
second source/drain regions at sides of the second gate electrode in the strained silicon substrate; and
first insulating layer portions in the strained silicon substrate under the first source/drain regions and second insulating layer portions in the strained silicon substrate under the second source/drain regions, wherein portions of the strained silicon substrate are between each of the first portions of the insulating layer and corresponding second portions of the insulating layer.

12. The semiconductor device of claim 11, wherein the insulating layer extends at least to a depletion point of the first and second source/drain regions.

13. The semiconductor device of claim 11, wherein the insulating layer is in the germanium layer of the strained silicon substrate.

14. The semiconductor device of claim 11, wherein the second silicon layer has a thickness of from about 50 Å to about 250 Å.

15. The semiconductor device of claim 11, wherein the germanium layer comprises silicon ($Si_{1-x}$) and germanium ($Ge_x$) in a composition ratio such that x is from about 0.1 to about 0.5.

16. The semiconductor device of claim 11, wherein the gate electrodes each overlap with one of the first insulating layer portions and one of the the second insulating layer portions.

17. A semiconductor device, comprising:
a strained silicon substrate having a first silicon layer, a germanium layer, and a second silicon layer in sequence, the strained silicon substrate having an active region and a field region;
a device isolation layer in the field region of the strained silicon substrate;
a gate electrode on the active region of the strained silicon substrate;
a gate insulating layer between the gate electrode and the second silicon layer;
source/drain regions at sides of the gate electrode in the strained silicon substrate; and
an insulating layer in the strained silicon substrate under the source/drain regions, wherein the device isolation layer contacts the insulating layer, and the gate insulating layer and the gate electrode are on the second silicon layer between first and second portions of the insulating layer.

18. The semiconductor device of claim 17, wherein the insulating layer extends at least to a depletion point of the source/drain regions.

19. The semiconductor device of claim 17, wherein the insulating layer is in the germanium layer of the strained silicon substrate.

20. The semiconductor device of claim 17, wherein the germanium layer comprises silicon ($Si_{1-x}$) and germanium ($Ge_x$) in a composition ratio where x is from 0.1 to 0.5.

* * * * *